(12) United States Patent
Blutman et al.

(10) Patent No.: US 10,270,448 B1
(45) Date of Patent: Apr. 23, 2019

(54) LEVEL SHIFTER CIRCUIT WITH TRANSISTOR DRIVE STRENGTH VARIATION COMPENSATION

(71) Applicant: NXP B.V., Eindhoven (NL)

(72) Inventors: Kristof Blutman, Eindhoven (NL); Sebastien Antonius Josephus Fabrie, Eindhoven (NL); Juan Diego Echeverri Escobar, Veldhoven (NL); Ajay Kapoor, Eindhoven (NL); Jose de Jesus Pineda de Gyvez, Eindhoven (NL); Hamed Fatemi, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/980,882

(22) Filed: May 16, 2018

(51) Int. Cl.
*H03K 19/0185* (2006.01)
(52) U.S. Cl.
CPC .......... *H03K 19/018507* (2013.01); *H03K 19/018514* (2013.01)
(58) Field of Classification Search
CPC ... H03K 19/018521; H03K 19/018514; H03K 19/018528; H03K 19/018507; H03K 19/0185; H03K 19/017509
See application file for complete search history.

(56) References Cited

U.S. PATENT DOCUMENTS 4,450,371 A * 5/1984 Bismarck ......... H03K 3/356017
326/102
5,867,040 A  2/1999 Fuse et al.
6,040,708 A * 3/2000 Blake ............... H03K 3/356113
326/33
6,479,974 B2 11/2002 Cohn et al.
(Continued)

FOREIGN PATENT DOCUMENTS

CN  101866635 A  10/2010
EP    3174203 A1  5/2017

OTHER PUBLICATIONS

Blutman, K., "A Low Power System-on-Chip with Memory Stacked on Top of Logic", Master Thesis, Electrical Engineering, Mathematics and Computer Sciences, Oct. 29, 2014.
(Continued)

Primary Examiner — Thomas J. Hiltunen
(74) Attorney, Agent, or Firm — David G. Dolezal

(57) ABSTRACT

A level shifter circuit is described herein for shifting a signal from a first voltage domain to a second voltage domain. The level shifter circuit includes two current paths between a supply terminal of the first voltage domain and a supply terminal of the second voltage domain. The first and second current paths each include a differential transistor that receives a signal from a pulse generator in a first voltage domain. The pulse generator provides pulses to the differential transistors based on an input signal to be translated to the second voltage domain. The level shifter includes a latch circuit in the second voltage domain that includes two inputs where each input is biased at a node of one of the current paths. Each current path includes a bias transistor whose control terminal receives a compensated biasing voltage for biasing the bias transistor. The compensated biasing voltage is compensated to account for drive strength variation of at least one transistor in each current path.

21 Claims, 4 Drawing Sheets

(56) References Cited

U.S. PATENT DOCUMENTS

| | | | |
|---|---|---|---|
| 6,563,372 B1* | 5/2003 | Fournel | H03K 3/356113 327/333 |
| 6,600,679 B2 | 7/2003 | Tanzawa et al. | |
| 6,670,841 B2* | 12/2003 | Kobayashi | H03K 3/356113 327/333 |
| 6,774,698 B1* | 8/2004 | Bhattacharya | H03K 3/356113 326/68 |
| 7,002,371 B2 | 2/2006 | Kase et al. | |
| 7,068,074 B2* | 6/2006 | Bhattacharya | H03K 3/356113 326/63 |
| 7,129,770 B2* | 10/2006 | Barkley | G05F 3/205 327/534 |
| 7,176,740 B2* | 2/2007 | Tachibana | H03K 3/356113 326/68 |
| 7,329,968 B2 | 2/2008 | Shepard et al. | |
| 7,397,279 B2* | 7/2008 | Bhattacharya | H03K 19/017509 326/63 |
| 7,589,578 B2* | 9/2009 | Shimizu | H03K 3/012 327/333 |
| 7,710,182 B2* | 5/2010 | Yu | H03K 3/356182 326/80 |
| 7,768,308 B2 | 8/2010 | Maede et al. | |
| 7,956,642 B2* | 6/2011 | Lee | H03K 3/356113 326/68 |
| 8,169,257 B2 | 5/2012 | Pelley | |
| 8,476,962 B2 | 7/2013 | Pelley | |
| 8,624,641 B1 | 1/2014 | Faucher et al. | |
| 8,686,785 B2 | 4/2014 | Koike | |
| 8,704,579 B2 | 4/2014 | Chen | |
| 8,878,387 B1 | 11/2014 | Wong et al. | |
| 2004/0090259 A1 | 5/2004 | Randazzo et al. | |
| 2006/0119390 A1 | 6/2006 | Sutardja | |
| 2010/0109705 A1 | 5/2010 | Pamperin | |
| 2010/0259299 A1 | 10/2010 | Dennard et al. | |
| 2011/0006828 A1 | 1/2011 | Chen et al. | |
| 2012/0256656 A1 | 10/2012 | Stirk et al. | |
| 2014/0300188 A1 | 10/2014 | Boezen | |
| 2014/0340142 A1 | 11/2014 | Wong et al. | |
| 2015/0102795 A1 | 4/2015 | Gao | |
| 2015/0346742 A1 | 12/2015 | Kapoor et al. | |
| 2017/0012627 A1 | 1/2017 | Kapoor et al. | |
| 2017/0012628 A1* | 1/2017 | Blutman | H03K 19/018514 |

OTHER PUBLICATIONS

Ismail, Y., "A compact stacked-device output driver in low-voltage CMOS Technology", IEEE International Symposium on Circuits and Systems, 2014.

Larsen, D., "High-voltage Pulse-triggered SR Latch Level-Shifter Design Considerations", IEEE 2014.

Liu, J., "A 1.8V to 10V CMOS level shifter for RFID transponders", http://www.researchgate.net/publication/251977168_A_1.8V_to_10V_CMOS_level_shifter_for_RFID_transponders, accessed May 26, 2015.

Liu, Z., "Building High-Frequency High-Voltage Switching Converters for Renewable Energy Systems", IEEE 2014.

Meyvaert, H., "A 1.65W Fully Integrated 90nm Bulk CMOS Capacitive DC-DC Converter with Intrinsic Charge Recycling", IEEE Transactions on Power Electronics, 28-9, 4327-4334, 2013.

Moghe, Y., "Nanosecond Delay Floating High Voltage Level Shifters in a 0.35 um HV-CMOS Technology", IEEE Journal of Solid-State Circuits, vol. 46, No. 2, Feb. 2011.

Mohammadi, B., "A 65 nm single stage 28 fJ/cycle 0.12 to 1.2V level-shifter", IEEE International Symposium on Circuits and Systems, 2014.

Pan, D., "A Low Voltage to High Voltage Level Shifter Circuit for MEMS Application", IEEE 2003.

Rajapandian, S., "High-Voltage Power Delivery Through Charge Recycling", IEEE Journal of Solid-State Circuits, vol. 41, No. 6, Jun. 2006.

Serneels, B., "A High speed, Low Voltage to High Voltage Level Shifter in Standard 1.2V 0.13μm CMOS", IEEE 2006.

Ueda, K., "Low-Power On-Chip Charge-Recycling DC-DC Conversion Circuit and System", IEEE Journal of Solid State Circuits, vol. 48, Issue 11. Aug. 15, 2013.

* cited by examiner

US 10,270,448 B1

LEVEL SHIFTER CIRCUIT WITH TRANSISTOR DRIVE STRENGTH VARIATION COMPENSATION

BACKGROUND OF THE INVENTION

Field of the Invention

This invention relates in general to level shifters.

Description of the Related Art

Level Shifters are utilized to shift signals from one voltage domain to another voltage domain.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

Figure 1:
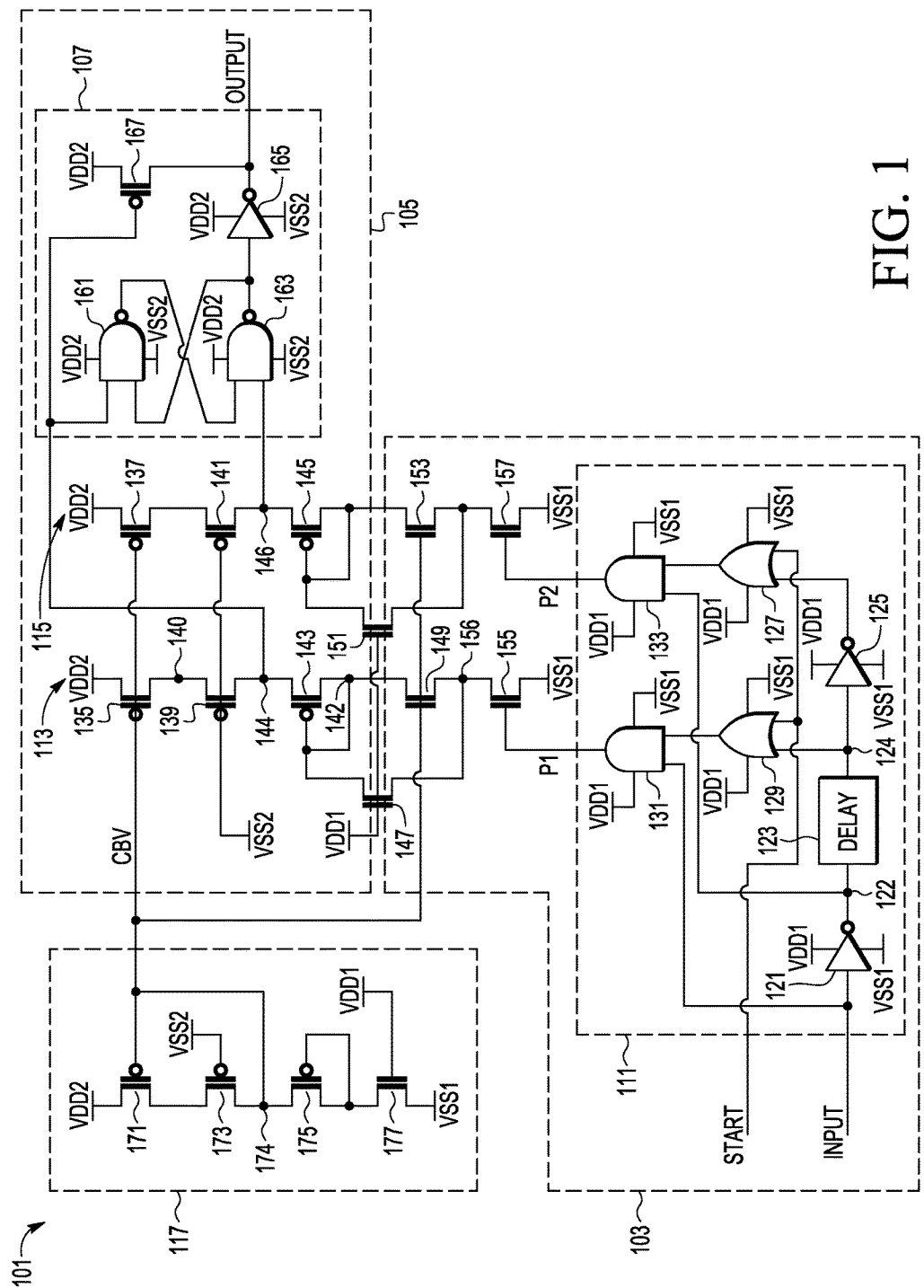
FIG. 1 is a circuit diagram of a level shifter circuit according to one embodiment of the present invention.

The following sets forth a detailed description of a mode for carrying out the invention. The description is intended to be illustrative of the invention and should not be taken to be limiting.

A level shifter circuit is described herein for shifting a signal from a first voltage domain to a second voltage domain. The level shifter circuit includes two current paths between a supply terminal of the first voltage domain and a supply terminal of the second voltage domain. The first and second current paths each include a differential transistor that receives a signal from a pulse generator in a first voltage domain. The pulse generator provides pulses to the differential transistors based on an input signal to be translated to the second voltage domain. The level shifter includes a latch circuit in the second voltage domain that includes two inputs where each input is biased at a node of one of the current paths. Each current path includes a bias transistor whose control terminal receives a compensated biasing voltage for biasing the bias transistor. The compensated biasing voltage is compensated to account for drive strength variation of at least one transistor in each current path.

With some embodiments of a level shifter circuit including a pulse generator and a latch circuit, the two current paths between a supply terminal of one voltage domain and a supply terminal of the other voltage domain are used to convert the pulse outputs in the first voltage domain to the latch inputs in the second voltage domain. Some level shifters include transistors sized (with larger breakdown voltages) to handle the voltage differential between the two voltage domains. However, transistors with larger breakdown voltages may have higher resistances and therefore decrease the speed of the level shifter. In addition, transistors with larger breakdown voltages also occupy more area which limits their applicability in high-density digital blocks. Bias transistors can be implemented in a current path to reduce the voltage drop across each transistor in the current path such that transistors with smaller breakdown voltages can be used in current paths. A bias transistor is a transistor whose control terminal (e.g. a gate for a MOSFET) is biased at a voltage to where the transistor provides a voltage drop in the current path.

One issue with utilizing transistors in a current path is that there may be variations of actual drive strengths of the transistors from designed drive strengths due to variations in process, voltage, and/or temperature and/or age. Drive strength is the current capacity of a transistor. In some embodiments, variations in transistor width and threshold voltage of a transistor can vary the drive strength of a transistor. For example, if the gate dielectric of a PMOS transistor is thicker than design due to a process variation, the threshold voltage of the PMOS transistor will be lower than the designed threshold voltage. If a current path uses both PMOS and NMOS transistors in the current path, a PMOS transistor with a lower than designed threshold voltage will provide a higher voltage drop than the NMOS transistor providing its designed voltage drop. In such a situation, the latch input voltage may need to be lower (or higher depending on latch design) than the designed latch trip point of the latch for the latch to change states. If the signal being translated to the higher voltage is a clock signal, a variation in the latch trip point may cause timing issues between the clock signal in the low voltage domain and the translated clock signal at the high voltage domain.

Other variations in drive strength may occur from variations in power supply voltage or bias voltages of the transistors of the current path. Also, drive strength may be affected by temperature differences where the strengths of the NMOS and PMOS transistors are affected differently at extreme temperatures of the effective operating range of the circuit. In addition, aging effects can also introduce drive strength variation asymmetry between PMOS and NMOS transistors since NBTI (Negative Bias Temperature Instability) type aging only affects the PMOS transistors.

Accordingly, with some embodiments of the present invention, the current paths include bias transistors that are biased at a compensated biasing voltage to account for variations in drive strength. Accordingly, if there are variations in the strength of transistors in the current paths, the compensated biasing voltage is adjusted to compensate for those variations to provide for a voltage shifting translation operation that is closer to design.

FIG. 1 is a circuit diagram of a level shifter circuit 101 according to one embodiment of the presentation invention. Level shifter circuit 101 is utilized by an integrated circuit to shift a signal (INPUT) from a low voltage domain (103) to a high voltage domain (105) (as the OUTPUT signal). In one embodiment, level shifter circuit 101 is used to level shift a clock signal for a microcontroller, but may be used in other circuits (e.g. in auto communications network integrated circuit) in other embodiments.

Level shifter circuit 101 includes a pulse generator 111 located in low voltage domain 103 and a latch circuit 107 located in a high voltage domain 105. Level shifter circuit 101 includes current paths 113 and 115 each including stacks of transistors coupled between the high voltage terminal (VDD2) of the high voltage domain 105 and the low voltage terminal (VSS1) of the low voltage domain 103. Level shifter circuit 101 also includes a compensated biasing circuit 117 for providing a compensated biasing voltage (CBV) for bias transistors 135, 137, 149, and 153 of current paths 113 and 115 to compensate for drive strengths of the transistors of current paths 113 and 115.

In one embodiment, voltage domain 103 and voltage domain 105 are stacked voltage domains. Two voltage domains are characterized as stacked voltage domains if the low voltage (VSS2) of the higher voltage domain is the same as the high voltage (VDD1) of the lower voltage domain. For example, in one embodiment of stacked voltage domains, VDD2 is 1.8 volts, VSS2 and VDD1 are 0.8 volts, and VSS1 is 0 volts, but these may be of other values in other embodiments. In still other embodiments, the voltage domains are not stacked voltage domains.

Pulse generator 111 includes an input to receive the signal to be shifted (INPUT), an input to receive the START signal, inverters 121 and 125, a delay circuit 123, OR gates 129 and 127, and AND gates 131 and 133. Pulse generator 111 includes two outputs (P1 and P2), each provided by one of AND gate 131 and AND gate 133. In one embodiment, P1 produces a pulse when the INPUT signal transitions from a low voltage value to a high voltage value and P2 produces a pulse when the INPUT signal transitions from a high voltage value to a low voltage value. In the embodiment shown, the length of the pulses is determined by the delay of delay circuit 123. The START signal is utilized to negate the providing of pulses at the latch outputs such that P1 provides the INPUT signal and P2 provide an inverted INPUT signal. The START signal can be used in resetting the output signal (OUTPUT), or when the INPUT signal is not a clock signal. The invertors, AND gates and OR gates of pulse generator 111 are biased at VDD1 and VSS1.

Current path 113 extends from supply terminal VDD2 to supply terminal VSS1 and includes PMOS bias transistor 135, PMOS bias transistor 139, diode configured PMOS transistor 143, NMOS bias transistor 147, NMOS bias transistor 149, and NMOS differential transistor 155. Current path 115 extends from supply terminal VDD2 to supply terminal VSS1 and includes PMOS bias transistor 137, PMOS bias transistor 141, diode configured PMOS transistor 145, NMOS bias transistor 153, NMOS bias transistor 149, and NMOS differential transistor 157. Transistors 147 and 149 are connected in parallel and transistors 151 and 153 are connected in parallel.

Current path 113 includes a node 144 connected to one input of latch circuit 107 and current path 115 includes a node 146 connected the other input of latch circuit 107. When node 144 is pulled to a low voltage value (e.g., about VSS2) the output (OUTPUT) of latch circuit 107 is latched at a high voltage value (VDD2). When node 146 is pulled to a low voltage value (e.g., approximately VSS2), OUTPUT is latched at a low value (VSS2).

Latch circuit 107 includes cross coupled NAND gates 161 and 163, inverter 165, and PMOS transistor 167. NAND gates 161 and 163 and inverter 165 are biased at VDD2 and VSS2.

Compensated biasing circuit 117 includes PMOS transistors 171 and 173 and NMOS transistors 175 and 177 that are configured in a stack of transistors. Transistor 173 is biased at VSS2, transistor 177 is biased at VDD1, transistor 171 is biased at node 174, and transistor 177 is diode configured. The compensated biasing voltage (CBV) is provided at node 174.

In other embodiments, level shifter circuit 101 may have other configurations, include other devices, other circuits, and/or include other types of devices. For example, in other embodiments, pulse generator 111 may include an S-R flip-flop and latch circuit 107 may include other latch configurations.

Figure 2:
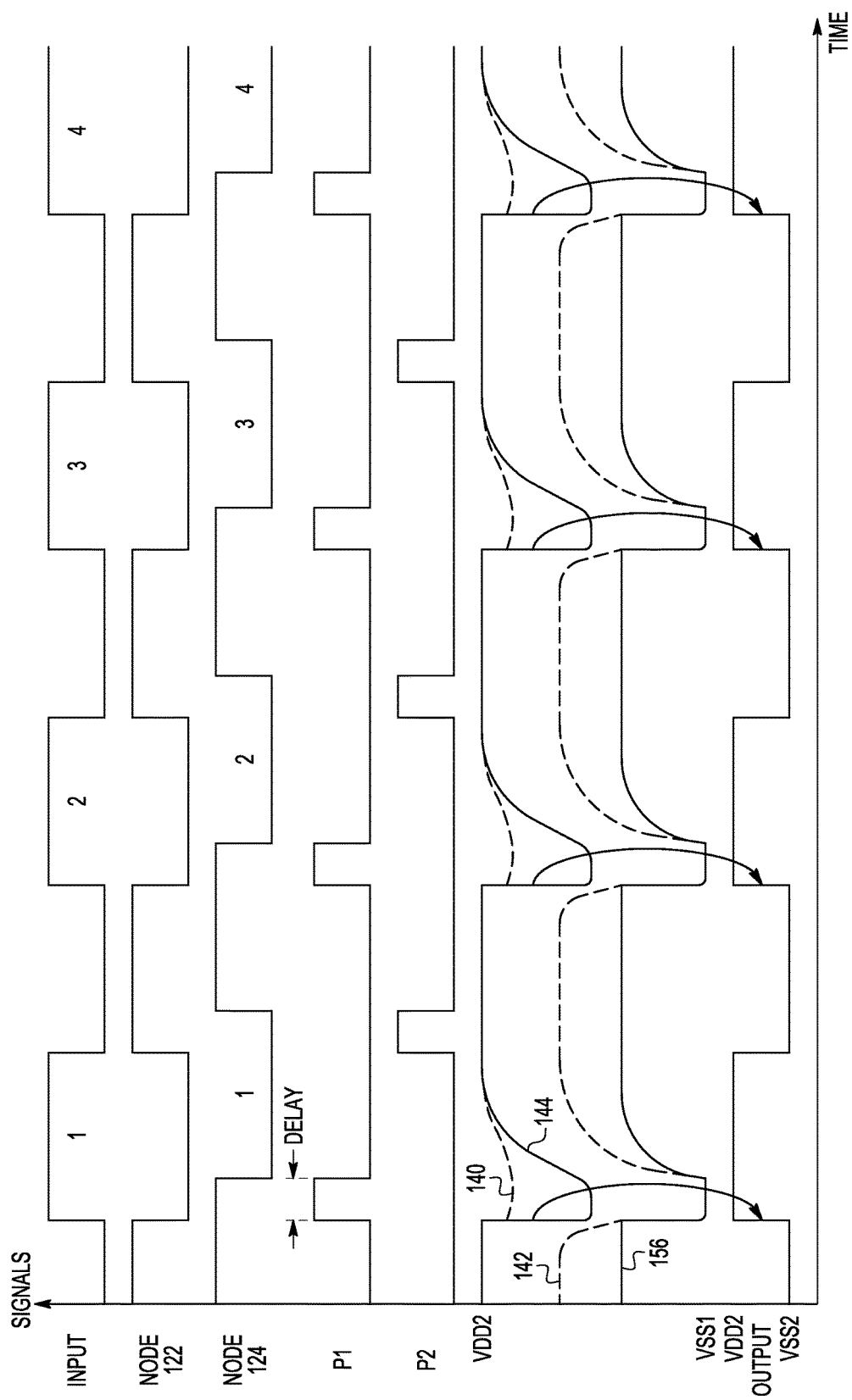
FIG. 2 is a timing diagram illustration the operation of a level shifter circuit according to one embodiment of the present invention.

FIG. 2 is a timing diagram illustrating the operation of level shifter circuit 101 according to one embodiment of the present invention. In the embodiment shown, INPUT signal is a clock signal with consecutively numbered ON times (1, 2, 3, 4) shown in FIG. 2. Node 122 produces an inverted INPUT signal. Delay circuit 123 delays the signal at node 122 by a delay time (indicated as DELAY in FIG. 2) to produce a delayed signal at node 124. The delayed signal is provided to OR gate 129 where its ORed with the START signal. In this example, the START signal is at a nonasserted low voltage value (VSS1). The output of OR gate 129 is ANDed with the START signal by AND gate 131 to produce the P1 signal. In the embodiment shown, when the START signal is at a low voltage value, the P1 signal is a series of pulses occurring at the rising edges of the INPUT signal. The on-time of the pulses is the delay time of delay circuit 123.

The P2 signal is generated by delay circuit 123, inverter 125, OR gate 127 and AND gate 133. In the embodiment shown, when the START signal is at a low voltage value, the P2 signal is a series of pulses occurring at the falling edges of the INPUT signal. The on-time of the pulses is the delay time of delay circuit 123.

By providing pulses for the P1 and P2 signals that are shorter than a ½ clock cycle the INPUT signal, the amount of time that current paths 113 and 115 are conductive is reduced.

FIG. 2 shows the effects of the pulses of the P1 signal in producing the voltages of the nodes of current path 113. The pulses of the P1 signal cause the rising edges of the OUTPUT signal. The pulses of the P2 signal cause the falling edges of the OUTPUT signal, although the timing diagram of FIG. 2 does not show the voltages of current path 115 that are generated by the P2 signal.

When the P1 signal is low, differential transistor 155 is not conductive such that only leakage current flows through path 113. Node 142 is a diode voltage drop from the voltage of node 144 (VDD2), and node 156 is a divided voltage drop (from the voltage divider of the pair of transistors 147 and 149 and transistor 155) from node 142.

The ON time of the P1 pulse causes differential transistor 155 to be conductive to generate a current through current path 113 which pulls the voltages of nodes 140, 144, 142, and 156 towards VSS1. However, because current path 113 includes bias transistors 135, 139, 147, and 149 and diode configured transistor 143, each node is not pulled all the way to VSS1. That way, the source-drain voltage across each transistor is less than voltage difference of VDD2-VSS1. In the embodiment shown, when the voltage of node 144 is pulled to a voltage below the latch trip point of latch circuit 107, it causes the OUTPUT signal to change states from a low voltage value (VSS2) to a high voltage value (VDD2).

When signal P1 goes back to a low voltage value, nodes 140, 144, 142, and 156 return to their previous voltage values when current path 113 was non-conductive. However, the OUTPUT signal stays latched at the high voltage state even when the voltage of node 144 climbs back above the latch trip point voltage.

Current path 115 operates in a similar manner with respect to signal P2 to latch the OUTPUT signal to a low voltage level (VSS2) when P2 is at a high voltage value (e.g. VDD1). When P2 is at a high voltage value, the voltage of node 146 is pulled to a voltage level below the trip point of latch circuit 107 to latch the OUTPUT signal a low voltage value (VSS2).

The amount of voltage drops provided by bias transistors (135, 139, 137, 141, 147, 149, 151, and 153) of a current path is dependent upon the biasing voltage at the control terminal (gate for a MOSFET) of the transistors. In the embodiment shown, the gates of transistors 139 and 141 are biased at fixed voltage VSS2, and the gates of transistors 147 and 151 are biased at fixed voltage VDD1.

The voltage drops across bias transistors 135, 137, 149, and 153 are controlled by a compensating bias voltage (CBV) generated by biasing circuit 117. In the embodiment shown, CBV is compensated to adjust for drive strength variations of the transistors of current paths 113 and 115. For example, if during manufacturing, a processing error causes the threshold voltages of the PMOS transistors to be higher than design, then bias transistors 139 and 141 each will provide a smaller voltage drop than expected because those transistors will be more conductive. With such a conduction, latch circuit 107 will trip slower than expected such that the transitions in the OUTPUT signal will be delayed with the transitions of the INPUT signal. The same effect may happen if the threshold voltages of the NMOS transistors are higher than design wherein the NMOS bias transistors provide a greater voltage drop. In some cases, either of these conditions may prevent latch circuit 107 from latching due to a pulse of P1 or P2.

If a process error causes the threshold voltages of the PMOS transistors or the NMOS transistors to be lower than design, then the level shifter may be susceptible to erroneously latching on transient voltages, and the voltage applied on logic gates 161 and 163 may exceed the specified reliability limit that can lead to faster aging.

Accordingly, level shifter circuit 101 includes a compensated biasing circuit 117 that provides a compensated biasing voltage (CBV) which compensates for variations in the drive strength of the transistors of the current paths. In one embodiment, circuit 117 includes PMOS transistors 171, 173, and 175 that are of the same type and size as PMOS transistor 135, 139, and 143, respectively. Circuit 117 also includes an NMOS transistor 177 that is of the same size and type as. In one embodiment, the transistors of circuit 117 are also of the same size and type as the corresponding transistors of current path 115.

If a processing error (or voltage or temperature condition) causes the threshold voltages of the PMOS transistors to be higher than design, then the voltage drops of transistors 135 and 139 will be less than design because the biasing voltages will make the transistor more conductive. However, the same processing error will also make transistors 171 and 173 more conductive to pull up the voltage of node 174 which provides CBV. A higher CBV increases the voltage drop across transistor 135 to compensate for the higher threshold voltage of the PMOS transistor, thereby biasing nodes 144 at its designed voltage for the output (OUTPUT) of latch circuit 107 to operate as designed. Likewise, if the threshold voltages of the PMOS transistors are lower than design, then voltage drop across the PMOS transistors will be higher than design and node 144 will be lower than expected thereby subjecting latch circuit 107 to false trips. With the higher PMOS voltage drops of transistors 171 and 173, the voltage at node 174 will decrease and voltage CBV will be lowered to reduce the voltage drop of transistor 135 to compensate for the lower voltage drop across transistor 139.

Circuit 117 also compensates for variations in strengths of the NMOS transistors as well. If a processing error (or voltage or temperature condition) causes the NMOS threshold voltage to be higher than design, then the voltage drop across the NMOS transistors will be higher than design which will push the voltage of node 144 higher than expected and cause the latch circuit to flip later than expected (or not flip at all). According, the voltage drop across transistor 177 will increase to raise the voltage of node 174 (and the voltage of CBV) to increase the conductivity of transistor 149 to lower its voltage drop to move node 144 back to its designed value. Circuit 117 also adjusts CBV if the NMOS threshold voltage is lower than design.

Accordingly, circuit 117 adjusts the compensating biasing voltage (CBV) for the variation in strengths of the NMOS and PMOS transistors of current paths 113 and 115 such that nodes 144 and 146 operate at their designed values for performing level shifting operations.

In some embodiments, an integrated circuit may include multiple level shifters. With some of these embodiments, compensated biasing circuit 117 may provide its biasing voltage to other level shifters of the integrated circuit as well. In other embodiments, each level shifter circuit would include its own biasing circuit 117.

In other embodiments, compensated biasing circuit 117 may have other configurations and/or provide more than one compensated biasing voltage. For example, in one embodiment, circuit 117 may include two NMOS transistor with the second NMOS transistor (not shown) located in parallel with transistor 177 to more closely match the transistor configuration of the current paths. The second transistor would be biased by the CBV voltage. In other embodiments, circuit 117 includes a differential transistor (similar to transistors 155 and 157) wherein the gate of the transistor is connected to receive a logical OR signal of the P1 and P2 signals. Which such a configuration, circuit 117 is only conductive during a pulse of the P1 or P2 signal. In other embodiments, circuit 117 may include a holding capacitor so that the transistor stack is not conductive at all times. In some embodiments, transistors 149 and 151 may receive a different biasing voltage from a different node of circuit 117 than which is provided to transistors 135 and 137.

In one embodiment, transistors 147 and 149 protect transistor 155 from excessively high voltages and transmit current pulses generated by transistor 155 to node 144. In the embodiment shown, bias NMOS transistors 147 and 149 are configured in parallel in the gate stack of current path 113. In other embodiments, transistors 147 and 149 may be configured in series. However, in some embodiments, if transistors 147 and 149 are configured in series, then the voltage drop between nodes 142 and 156 may be too large to where node 144 would not have enough voltage swing to flip latch circuit 107. Connecting transistors 147 or 149 in parallel reduces the voltage drop between nodes 142 and 156 while still allowing for drive strength compensation with the CBV voltage. In the embodiment shown, transistors 135 and 139 function as variable resistors. Transistors 135 and 139 are series connected such that there will be an adequate voltage drop provided regardless of whether the CBV or VSS2 is higher in voltage.

In other embodiments, the current paths 113 and 115 may have other configurations. For example, each current path may include more than one PMOS and/or more than one NMOS transistor that is biased at a compensated biasing voltage. For example, transistors 139 and 141 may also be biased with CBV or by another node of circuit 117. In some embodiments, the current paths do not include fixed bias transistors. However, in some embodiments, the fixed bias transistors in current paths 113 and 115 ensure that the voltage swings on nodes 144 and 146 are dependent on the supply voltage values, while the compensated bias transistors ensure that the voltage swings are also compensated for factors such as PVT and aging variations.

In the embodiment shown, pulse generator 111 receives a START signal that is used to turn off the pulse feature wherein the P1 and P2 signals are the INPUT signal and the inverted INPUT signal (inverted by inverter 121), respectively. Such a signal may be used at startup to place the OUTPUT signal in a known state that is set by a reset state of the INPUT signal. It may also be used at other times when the input signal is not a clock signal. The asserted START signal being at a high voltage turns AND gates 131 and 133 into pass through gates thereby negating the effect of OR gates 129 and 127 and delay circuit 123 in generating pulses at P1 and P2. The START signal may be utilized in other ways in other embodiments of a pulse generation circuit.

Figure 3:
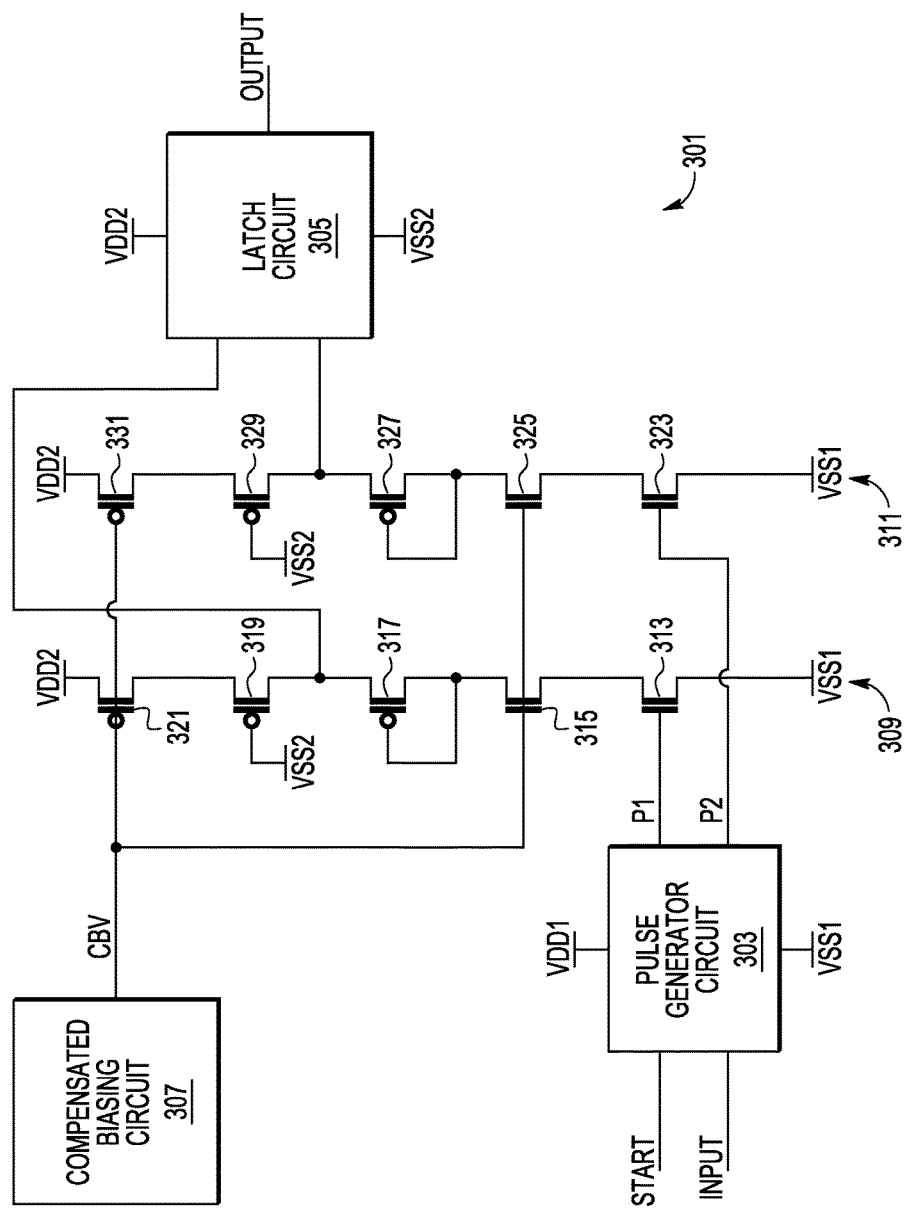
FIG. 3 is a circuit diagram of a level shifter circuit according to one embodiment of the present invention.

FIG. 3 shows another embodiment of a level shifter circuit 301. Circuit 301 includes a pulse generator 303, a latch circuit 305, a compensated biasing circuit 307 and current paths 309 and 311. Path 309 includes differential transistor 313, NMOS bias transistor 315, PMOS diode configured transistor 317, PMOS bias transistor 319, and PMOS bias transistor 321. Transistors 321 and 315 are biased by a compensated biasing voltage from circuit 307. Path 311 includes differential transistor 323, NMOS biasing transistor 325, PMOS diode configured transistor 327, PMOS bias transistor 329, and PMOS bias transistor 331. Transistors 331 and 325 are biased by a compensated biasing voltage from circuit 307.

Level shifter circuit 301 is similar to level shifter circuit 101 except that level shifter circuit 301 does not include NMOS bias transistors 147 and 151. In this embodiment, the operating range in terms of supply voltage is more limited than compared with the embodiment of FIG. 1 since transistors 315 and 325 would have to provide a higher voltage drop if the VDD1 to VSS1 voltage is considerably higher than the VDD2 to VSS2 voltage. Such a higher voltage drop may not provide enough voltage swing for the inputs of latch circuit 305 in such supply voltage conditions.

Figure 4:
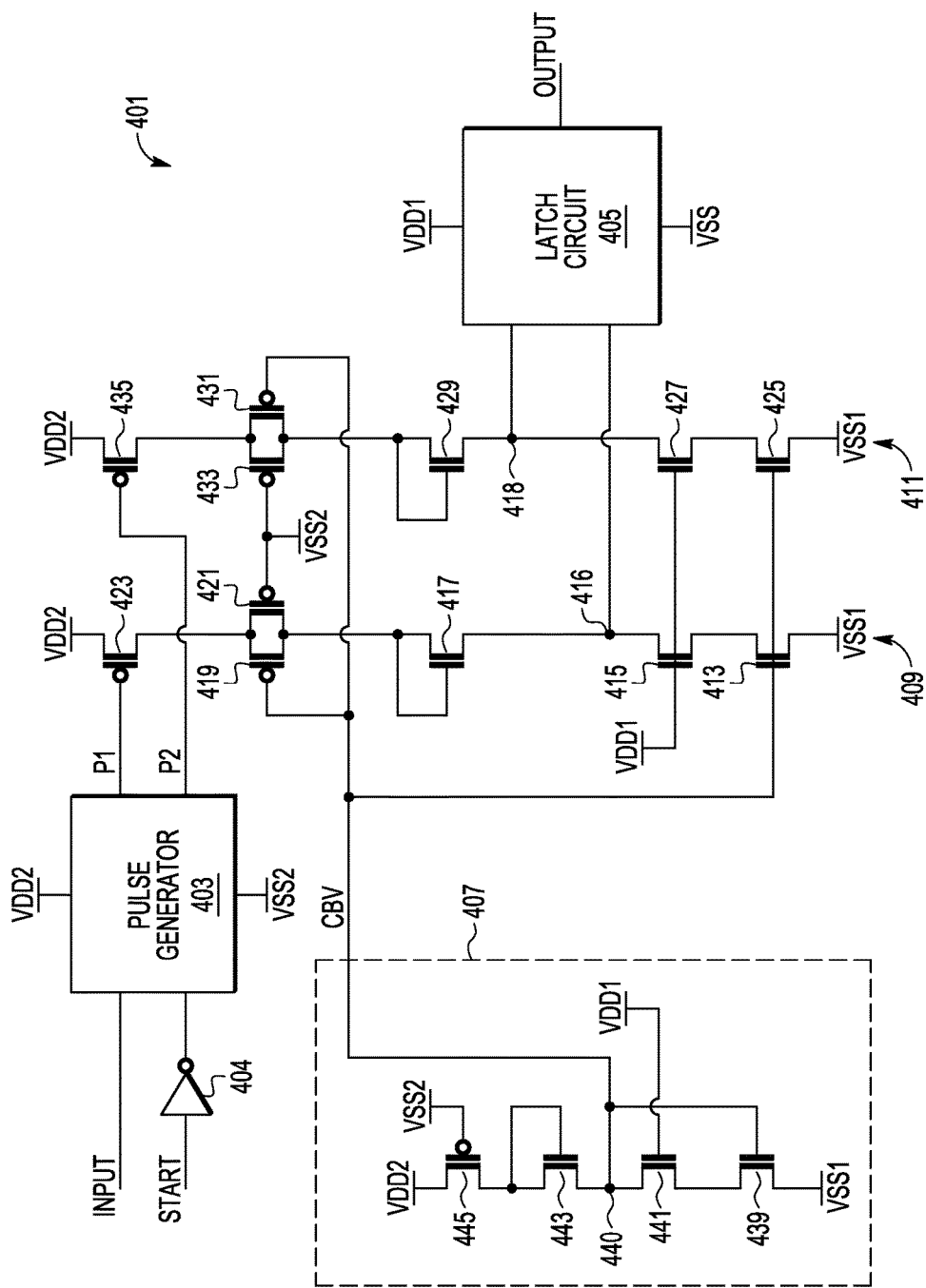
FIG. 4 is a circuit diagram of a level shifter circuit according to one embodiment of the present invention.

FIG. 4 is a circuit diagram of a level shifter circuit 401 that shifts a signal (INPUT) from a high voltage domain (VDD2, VSS2) to a low voltage domain (VDD1, VSS1) (as the OUTPUT signal). In one embodiment, the two voltage domains are stacked voltage domains. In other embodiments, they are not stacked voltage domains. In one embodiment, VDD2 is 1.8 volts, VSS2 and VDD1 are 0.8 volts, and VSS1 is 0 volts.

Circuit 401 includes a pulse generator 403 in the second voltage domain and a latch circuit 405 in the first voltage domain. Pulse generator provides two output signals P1 and P2, which in one embodiment (when the START signal is negated) are each a series of asserted low pulses that occur at the rising edges and falling edges, respectively of the INPUT signal.

Level shifter circuit 401 includes current path 409 and current path 411. Each current path extends from a low supply voltage terminal (VSS1) of the low voltage domain to a high voltage supply terminal (VDD2) of the high voltage domain. Current path 409 includes NMOS bias transistor 413, NMOS bias transistor 415, NMOS diode configured transistor 417, PMOS bias transistor 419, PMOS bias transistor 421, and PMOS differential transistor 423. Current path 411 includes NMOS bias transistor 425, NMOS bias transistor 427, NMOS diode configured transistor 429, PMOS bias transistor 431, and PMOS differential transistor 435. Bias transistor 419, 431, 413, and 425 are biased by a compensated biasing voltage (CBV) from compensated biasing circuit 407. Bias transistors 421 and 433 are biased by fixed voltage VSS2 and bias transistors 415 and 427 are biased by fixed voltage VDD1. The bias transistors operate to reduce the source-drain voltage across each transistor of a current path to a level that is less than the difference of VDD2 minus VSS1. Node 416 of path 409 is connected to one input of latch circuit 405 and node 418 of path 411 is connected to another input of latch circuit 405.

Current paths 409 and 411 operated in a similar manner to current paths 113 and 115 to flip the latch states of latch circuit 405 in response to the P1 and P2 signals. One difference however is that current paths 409 and 411 pull the voltages of nodes 416 and 418 higher to flip the latch states of latch circuit 405 during asserted low pulses of P1 and P2. Whereas current paths 113 and 115 pull the voltages of nodes 144 and 146 lower to flip the latch states of latch circuit 107 (see FIG. 2) during asserted high pulses of P1 and P2.

Level shifter circuit 401 includes a compensated biasing circuit 407 for producing a compensated biasing voltage that is compensated for variations in drive strengths of the transistors of current paths 409 and 411. Circuit 407 includes a transistor stack of PMOS bias transistor 445, NMOS diode configured transistor 443, NMOS bias transistor 441, and NMOS bias transistor 439. Transistor 445 is biased by supply voltage VSS2, transistor 441 is biased by supply voltage VDD1, and transistor 439 is biased by node 440 which produces the compensated bias voltage (CBV). Circuit 407 increases or decreases CBV to compensate for variations in the strength of the transistors of paths 409 and 411. Circuit 401 may have other configurations in other embodiments.

Although the level shifters described herein are implemented with MOSFETS, other embodiments may be implemented with other devices including other types of transistors (e.g. bipolar devices). Also, a level shifter circuit may include different configurations. For example, the INPUT and/or OUTPUT signals may be differential signals. Also in other embodiments, each current path may only include one bias transistor that is biased by a compensated biasing voltage. Features shown or describe with respect to one embodiment, may be implemented with other embodiments shown or described herein.

In one embodiment, a level shifter circuit includes a pulse generator in a first voltage domain. The pulse generator includes an input to receive a signal to be shifted. The pulse generator includes a first output and a second output. Each of the first output and the second output provide pulses based on the signal. The level shifter circuit includes a latch circuit in a second voltage domain. The latch circuit includes an output to provide in the second voltage domain a voltage shifted signal of the signal. The latch circuit includes a first input and a second input. The level shifter circuit includes a first current path between a supply terminal of the first voltage domain and a supply terminal of the second voltage domain. The first current path includes a first node. The first input of the latch circuit is electrically coupled to the first node to be biased by the first node. The first current path includes a first differential transistor having a control terminal coupled to the first output of the pulse generator to receive pulses from the first output of the pulse generator. The first current path including a first bias transistor including a control terminal coupled to receive a compensated biasing voltage for biasing the first bias transistor to account for drive strength variation of at least one transistor in the first current path. The level shifter circuit includes a second current path between the supply terminal of the first voltage domain and the supply terminal of the second voltage domain. The second current path including a second node. The second input of the latch circuit is electrically coupled to be biased by the second node. The second current path includes a second differential transistor having a control terminal coupled to the second output of the pulse generator to receive pulses from the second output of the pulse generator. The second current path includes a second bias transistor including a control terminal coupled to receive a compensated bias voltage for biasing the second bias transistor to account for drive strength variation of at least one transistor in the second current path.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A level shifter circuit comprising:
    a pulse generator in a first voltage domain, the pulse generator including an input to receive a signal to be shifted, the pulse generator including a first output and a second output, each of the first output and the second output to provide pulses based on the signal;
    a latch circuit in a second voltage domain, the latch circuit including an output to provide in the second voltage domain a voltage shifted signal of the signal, the latch circuit including a first input and a second input;
    a first current path between a supply terminal of the first voltage domain and a supply terminal of the second voltage domain, the first current path including a first node, the first input of the latch circuit electrically coupled to the first node to be biased by the first node, the first current path including a first differential transistor having a control terminal coupled to the first output of the pulse generator to receive pulses from the first output of the pulse generator, the first current path including a first bias transistor including a control terminal coupled to receive a compensated biasing voltage for biasing the first bias transistor to account for drive strength variation of at least one transistor in the first current path;
    a second current path between the supply terminal of the first voltage domain and the supply terminal of the second voltage domain, the second current path including a second node, the second input of the latch circuit electrically coupled to be biased by the second node, the second current path including a second differential transistor having a control terminal coupled to the second output of the pulse generator to receive pulses from the second output of the pulse generator, the second current path including a second bias transistor including a control terminal coupled to receive a compensated bias voltage for biasing the second bias transistor to account for drive strength variation of at least one transistor in the second current path;
    wherein the first current path includes a third bias transistor and the second current path includes a fourth bias transistor, wherein the third bias transistor and the fourth bias transistor each include control inputs biased to a fixed bias source.

2. The level shifter circuit of claim 1 wherein the first bias transistor and the third bias transistor are coupled in series in the first current path and the second bias transistor and the fourth bias transistor are coupled in series in the second current path.

3. The level shifter circuit of claim 1 wherein the first current path further includes a third bias transistor and the second current path includes a fourth bias transistor.

4. The level shifter circuit of claim 3 wherein the first bias transistor and the second bias transistor are of a first conductivity type and the third bias transistor and the fourth bias transistor are of a second conductivity type opposite the first conductivity type.

5. The level shifter circuit of claim 4 wherein:
    the first bias transistor is located in the first current path between the first node and the supply terminal of the second voltage domain;
    the second bias transistor is located in the second current path between the second node and the supply terminal of the second voltage domain;
    the third bias transistor is located in the first current path between the first node and the supply terminal of the first voltage domain;
    the fourth bias transistor is located in the second current path between the second node and the supply terminal of the first voltage domain.

6. The level shifter circuit of claim 5 wherein the control terminals of the first bias transistor, the second bias transistor, the third bias transistor, and the fourth bias transistor are each coupled to be biased by an output of a compensated bias circuit.

7. The level shifter circuit of claim 1 further comprising:
    a compensated biasing circuit including an output for proving the compensated bias voltage.

8. The level shifter circuit of claim 7 wherein the compensated biasing circuit includes a stack of transistors to provide a current path between the supply terminal of the first voltage domain and the supply terminal of the second voltage domain, wherein the compensated bias voltage is provided by a node of the current path.

9. The level shifter circuit of claim 8 wherein the stack of transistors includes a first transistor having a control terminal biased at a second supply terminal of the second voltage domain that is at different supply voltage that the supply terminal of the second voltage domain.

10. The level shifter circuit of claim 8 wherein the stack of transistors includes a first transistor being of a same size and conductivity type as the first bias transistor and the second bias transistor.

11. The level shifter circuit of claim 1 wherein the first voltage domain and the second voltage domain are stacked voltage domains.

12. The level shifter circuit of claim 1 wherein the supply terminal of the first voltage domain is configured to provide a lower voltage than the supply terminal of the second voltage domain.

13. The level shifter circuit of claim 1 wherein the supply terminal of the first voltage domain is configured to provide a higher voltage than the supply terminal of the second voltage domain.

14. The level shifter circuit of claim 11 wherein the pulse generator includes a second input coupled to receive a signal that when asserted causes the pulse generator to provide the signal to be shifted at the first output and an inverted signal to be shifted at the second output.

15. The level shifter circuit of claim 1 wherein the first bias transistor is biased to provide a voltage drop in the first current path during operation and the second bias transistor is biased to provide a voltage drop in the second current path during operation.

16. The level shifter circuit of claim 1 wherein the control inputs of the third bias transistor and the fourth bias transistor are biased to a supply terminal of one of the first voltage domain or the second voltage domain.

17. The level shifter circuit of claim 1 further comprising a compensated biasing circuit including an output for proving the compensated bias voltage for biasing the first bias transistor and the second bias transistor, wherein the compensated biasing circuit adjusts the compensated biasing voltage with respect to a fixed voltage source for biasing the first bias transistor and the second bias transistor to account for drive strength variation of at least one transistor in the first current path and at least one transistor in the second current path.

18. A level shifter circuit comprising:
a pulse generator in a first voltage domain, the pulse generator including an input to receive a signal to be shifted, the pulse generator including a first output and a second output, each of the first output and the second output to provide pulses based on the signal;
a latch circuit in a second voltage domain, the latch circuit including an output to provide in the second voltage domain a voltage shifted signal of the signal, the latch circuit including a first input and a second input;
a first current path between a supply terminal of the first voltage domain and a supply terminal of the second voltage domain, the first current path including a first node, the first input of the latch circuit electrically coupled to the first node to be biased by the first node, the first current path including a first differential transistor having a control terminal coupled to the first output of the pulse generator to receive pulses from the first output of the pulse generator, the first current path including a first bias transistor including a control terminal coupled to receive a compensated biasing voltage for biasing the first bias transistor to account for drive strength variation of at least one transistor in the first current path;
a second current path between the supply terminal of the first voltage domain and the supply terminal of the second voltage domain, the second current path including a second node, the second input of the latch circuit electrically coupled to be biased by the second node, the second current path including a second differential transistor having a control terminal coupled to the second output of the pulse generator to receive pulses from the second output of the pulse generator, the second current path including a second bias transistor including a control terminal coupled to receive a compensated bias voltage for biasing the second bias transistor to account for drive strength variation of at least one transistor in the second current path;
wherein the first current path includes a third bias transistor and the second current path includes a fourth bias transistor, wherein the third bias transistor and the fourth bias transistor each include control inputs biased to a fixed bias source;
wherein the first bias transistor and the third bias transistor are coupled in parallel in the first current path and the second bias transistor and the fourth bias transistor are coupled in parallel in the second current path.

19. The level shifter circuit of claim 18 wherein the first bias transistor and the third bias transistor are coupled in parallel in the first current path between the first differential transistor and the first node, and the second bias transistor and the fourth bias transistor are coupled in parallel in the second current path between the second differential transistor and the second node.

20. A level shifter circuit comprising:
a pulse generator in a first voltage domain, the pulse generator including an input to receive a signal to be shifted, the pulse generator including a first output and a second output, each of the first output and the second output to provide pulses based on the signal;
a latch circuit in a second voltage domain, the latch circuit including an output to provide in the second voltage domain a voltage shifted signal of the signal, the latch circuit including a first input and a second input;
a first current path between a supply terminal of the first voltage domain and a supply terminal of the second voltage domain, the first current path including a first node, the first input of the latch circuit electrically coupled to the first node to be biased by the first node, the first current path including a first differential transistor having a control terminal coupled to the first output of the pulse generator to receive pulses from the first output of the pulse generator, the first current path including a first bias transistor including a control terminal coupled to receive a compensated biasing voltage for biasing the first bias transistor to account for drive strength variation of at least one transistor in the first current path;
a second current path between the supply terminal of the first voltage domain and the supply terminal of the second voltage domain, the second current path including a second node, the second input of the latch circuit electrically coupled to be biased by the second node, the second current path including a second differential transistor having a control terminal coupled to the second output of the pulse generator to receive pulses from the second output of the pulse generator, the second current path including a second bias transistor including a control terminal coupled to receive a compensated bias voltage for biasing the second bias transistor to account for drive strength variation of at least one transistor in the second current path;
wherein the first current path includes a third bias transistor and the second current path includes a fourth bias transistor, wherein the third bias transistor and the fourth bias transistor each include control inputs biased to a fixed bias source;
wherein the first bias transistor and the third bias transistor are coupled in series in the first current path and the second bias transistor and the fourth bias transistor are coupled in series in the second current path;
wherein the first bias transistor and the third bias transistor are coupled in series in the first current path between the supply terminal of the second voltage domain and the first node, wherein the second bias transistor and the fourth bias transistor are coupled in series in the second current path between the supply terminal of the second voltage domain and the second node.

21. A level shifter circuit comprising:
a pulse generator in a first voltage domain, the pulse generator including an input to receive a signal to be shifted, the pulse generator including a first output and a second output, each of the first output and the second output to provide pulses based on the signal;
a latch circuit in a second voltage domain, the latch circuit including an output to provide in the second voltage domain a voltage shifted signal of the signal, the latch circuit including a first input and a second input;

a first current path between a supply terminal of the first voltage domain and a supply terminal of the second voltage domain, the first current path including a first node, the first input of the latch circuit electrically coupled to the first node to be biased by the first node, the first current path including a first differential transistor having a control terminal coupled to the first output of the pulse generator to receive pulses from the first output of the pulse generator, the first current path including a first bias transistor including a control terminal coupled to receive a compensated biasing voltage for biasing the first bias transistor to account for drive strength variation of at least one transistor in the first current path;

a second current path between the supply terminal of the first voltage domain and the supply terminal of the second voltage domain, the second current path including a second node, the second input of the latch circuit electrically coupled to be biased by the second node, the second current path including a second differential transistor having a control terminal coupled to the second output of the pulse generator to receive pulses from the second output of the pulse generator, the second current path including a second bias transistor including a control terminal coupled to receive a compensated bias voltage for biasing the second bias transistor to account for drive strength variation of at least one transistor in the second current path;

a compensated biasing circuit including an output for proving the compensated bias voltage;

wherein the compensated biasing circuit includes a stack of transistors to provide a current path between the supply terminal of the first voltage domain and the supply terminal of the second voltage domain, wherein the compensated bias voltage is provided by a node of the current path;

wherein the first current path includes a first diode configured transistor of a first conductivity type and a first size the second current path includes a second diode configured transistor of the first conductivity type and the first size, and the stack of transistors includes a third diode configured transistor of the first conductivity type and first size.

* * * * *